(12) United States Patent
Hsu et al.

(10) Patent No.: US 9,153,781 B2
(45) Date of Patent: Oct. 6, 2015

(54) METHOD FOR MANUFACTURING RESISTIVE RANDOM ACCESS STORAGE UNIT

(71) Applicant: CSMC TECHNOLOGIES FAB2 CO., LTD., Jiangsu (CN)

(72) Inventors: Tsung-Nten Hsu, Jiangsu (CN); Zhaoyu Yang, Jiangsu (CN); Zhiyong Zhao, Jiangsu (CN); Chunshan Lu, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 14/355,500

(22) PCT Filed: Oct. 22, 2012

(86) PCT No.: PCT/CN2012/083280
§ 371 (c)(1),
(2) Date: Apr. 30, 2014

(87) PCT Pub. No.: WO2013/064021
PCT Pub. Date: May 10, 2013

(65) Prior Publication Data
US 2015/0126014 A1 May 7, 2015

(30) Foreign Application Priority Data
Nov. 1, 2011 (CN) .......................... 2011 1 0341217

(51) Int. Cl.
*H01L 21/311* (2006.01)
*H01L 45/00* (2006.01)

(52) U.S. Cl.
CPC ............ *H01L 45/1633* (2013.01); *H01L 45/04* (2013.01); *H01L 45/08* (2013.01); *H01L 45/1233* (2013.01); *H01L 45/145* (2013.01); *H01L 45/146* (2013.01); *H01L 45/1616* (2013.01); *H01L 45/1675* (2013.01); *H01L 45/1683* (2013.01)

(58) Field of Classification Search
CPC ..................... H01L 21/0228; H01L 21/02389; H01L 21/02145; H01L 21/28079; H01L 21/3212; H01L 21/8229; H01L 21/823835; H01L 21/76889; H01L 21/02175; H01L 21/76205; H01L 21/76831
See application file for complete search history.

(56) References Cited

U.S. PATENT DOCUMENTS

| 7,217,988 | B2 * | 5/2007 | Ahlgren et al. | ............... 257/584 |
| 7,611,953 | B2 * | 11/2009 | Ahlgren et al. | ............... 438/309 |
| 8,018,568 | B2 * | 9/2011 | Allemand et al. | ............ 349/187 |
| 2009/0200536 | A1 * | 8/2009 | Van Schaijk et al. | ............. 257/4 |

FOREIGN PATENT DOCUMENTS

| CN | 1976082 A | 6/2007 |
| CN | 101459220 A | 6/2009 |
| CN | 100563041 C | 11/2009 |

* cited by examiner

*Primary Examiner* — David Nhu
(74) *Attorney, Agent, or Firm* — Muncy, Geissler, Olds & Lowe, P.C.

(57) ABSTRACT

A manufacturing method of a resistive random access storage unit, includes: forming a resistance layer on a first metal layer having a flat surface; forming a passivation layer on the resistance layer; performing an etching process to obtain a plurality of basic units, a basic unit comprising a first metal layer, a resistance layer, and a passivation layer, which are laminated sequentially; depositing a insulating dielectric layer, and flattening the insulating dielectric layer; etching the insulating dielectric layer and the passivation layer to form contacting holes corresponded to the basic units; filling metal wires in the contacting holes; forming a second metal layer. According to the above method, a uniformly distributed resistance can be formed on a whole wafer.

5 Claims, 4 Drawing Sheets

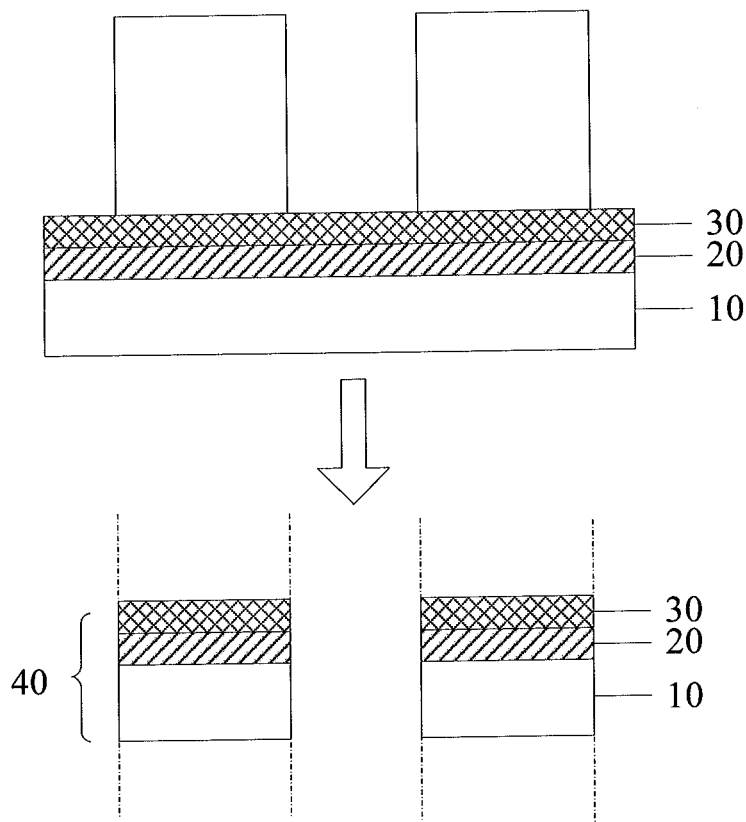

METHOD FOR MANUFACTURING RESISTIVE RANDOM ACCESS STORAGE UNIT

FIELD OF THE INVENTION

The present invention relates to a field of memories, and more particularly relates to a manufacturing method of a resistive random access storage unit.

BACKGROUND OF THE INVENTION

With the development of technology, a capacity, an energy consumption, and a accessing speed of the conventional NAND flash memory have reached bottlenecks.

A resistive random access memory (RRAM) is a new non-volatile random access memory. Its principle is to use a resistance mutation of a special metal oxide near a threshold voltage to represent 0 and 1 of a storage unit. RRAM has characteristics of larger capacity, lower energy consumption and faster accessing speed.

A basic storage unit of the RRAM includes two metal layers and a resistance layer sandwiched between the two metal layers. Conventionally, the resistance layer is made of $WO_x$. A manufacturing process is compatible with a conventional MOS process. The manufacturing process includes: filling a tungsten plug on a base metal, grinding and oxidizing the tungsten metal, then forming a metal layer.

However, there are problems in the manufacturing process, which leads to an uneven distribution of resistance on the wafer.

SUMMARY OF THE INVENTION

According to this, it is necessary to provide a manufacturing method of the resistive random access storage unit with uniform distributed resistance.

A manufacturing method of a resistive random access storage unit, includes the following steps:

forming a resistance layer on a first metal layer having a flat surface;

forming a passivation layer on the resistance layer;

performing an etching process to obtain a plurality of basic units, the basic unit comprising the first metal layer, the resistance layer, and the passivation layer, which are laminated sequentially;

depositing a insulating dielectric layer, and flattening the insulating dielectric layer;

etching the insulating dielectric layer and the passivation layer to form a contacting hole corresponding to the basic unit;

filling the contacting hole with a metal wire; and forming a second metal layer.

Preferably, a step of forming a resistance layer on a first metal layer specifically includes:

depositing a resistance substrate layer on the first metal layer;

oxidizing the resistance substrate layer to obtain an oxide of the resistance substrate layer, a resistance layer is formed.

Preferably, the resistance substrate layer is a tungsten layer, the resistance layer is a tungsten oxide layer.

Preferably, a step of forming a passivation layer on the resistance layer specifically comprises depositing a nitride layer on the resistance layer by performing a chemical vapor deposition process.

Preferably, the first metal layer and the second metal layer are both aluminum layers.

In the above manufacturing method, as a resistance layer is first formed on the first metal layer, and the first metal layer is easy to be flattened, when a resistance layer is formed, especially, when the resistance layer is formed by a metal oxidizing method, the resistance of the resistance layer will be uniformly distributed.

BRIEF DESCRIPTION OF THE DRAWINGS

FIG. 3 is a schematic view of a layered structure;

FIG. 4 is a schematic view illustrating a formation of a plurality of basic units;

DETAILED DESCRIPTION OF THE EMBODIMENTS

Figure 1:
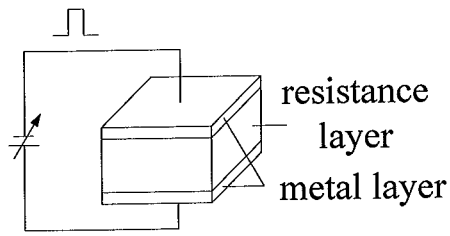
FIG. 1 is a schematic view showing a working principle of a resistive random access storage unit.

Referring to FIG. 1, it is a schematic view showing a working principle of a resistive random access storage unit. The resistive random access storage unit includes two metal layers and a resistance layer sandwiched between the two metal layers. A pulse voltage applied to the two metal layers can make a resistance mutation of the resistance layer, and two different resistances are obtained.

The resistive random access memory includes a large amount of resistive random access storage units shown in FIG. 1, each storage unit can have two states representing 0 and 1, which can be used to store data.

Figure 2:
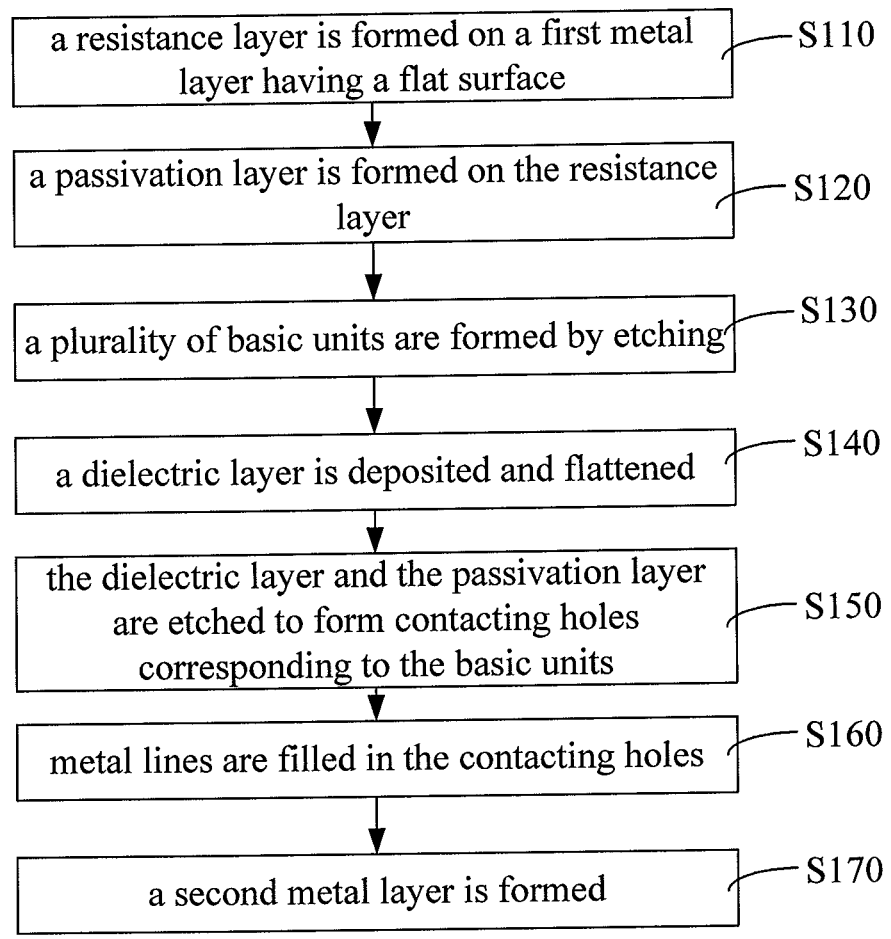
FIG. 2 is a flow chart of a manufacturing method of the resistive random access storage unit according to one embodiment.

Referring to FIG. 2, it is a flow chart showing a manufacturing method of the resistive random access storage unit according to one embodiment. The method includes the following steps:

Step S110, a resistance layer is formed on the first metal layer having a flat surface. Referring to FIG. 3, the first metal layer 10 has a flat surface, a resistance layer 20 is formed on the first metal layer 10. The first metal layer 10 is preferably made of aluminum; the resistance layer 20 is made of a special metal oxide, such as tungsten oxide and nickel oxide etc. The resistance layer 20 has a feature of resistance mutation on both sides of the threshold voltage. In the illustrated embodiment, the resistance layer is preferably made of tungsten oxide.

The step S110 specifically includes:

A resistance substrate layer is deposited on the first metal layer 10. The resistance substrate layer is made of a special metal, such as tungsten (W) and nickel (Ni) etc.

The resistance substrate layer is oxidized to obtain an oxide of the resistance substrate layer, and a resistance layer, i.e. a WOx or a NiO layer, is formed.

Step S120, a passivation layer is formed on the resistance layer. Referring to FIG. 3, the passivation layer 30 is formed on the resistance layer as a protecting layer, which is used to protect the resistance layer 20. In the illustrated embodiment, the passivation 30 layer is preferably a nitride layer, which is formed by chemical vapor deposition method.

Step S130, a plurality of basic units are formed by etching, the basic unit includes the first metal layer 10, the resistance layer 20, and the passivation layer 30, which are sequentially laminated. A plurality of basic units 40 shown in FIG. 4 are formed by etching a layered structure shown in FIG. 3 using a mask. The basic unit 40 is the same as the layered structure shown in FIG. 3 and includes the first metal layer 10, the resistance layer 20, and the passivation layer 30, which are sequentially laminated.

Figure 5:
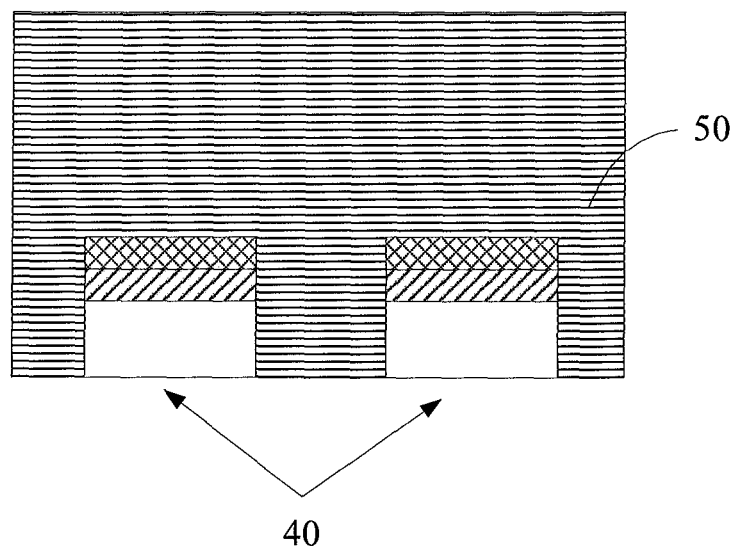
FIG. 5 is a schematic view showing a structure after a insulating dielectric layer is deposited.

Step S140, an insulating dielectric layer is deposited and flattened. After a plurality of basic units 40 are formed in the step S130, an insulating dielectric layer 50 is deposited, the insulating dielectric layer covers a surface of the basic unit 40, and fills gaps of the basic units. Then the insulating dielectric layer 50 is flattened to form a structure shown in FIG. 5.

Figure 6:
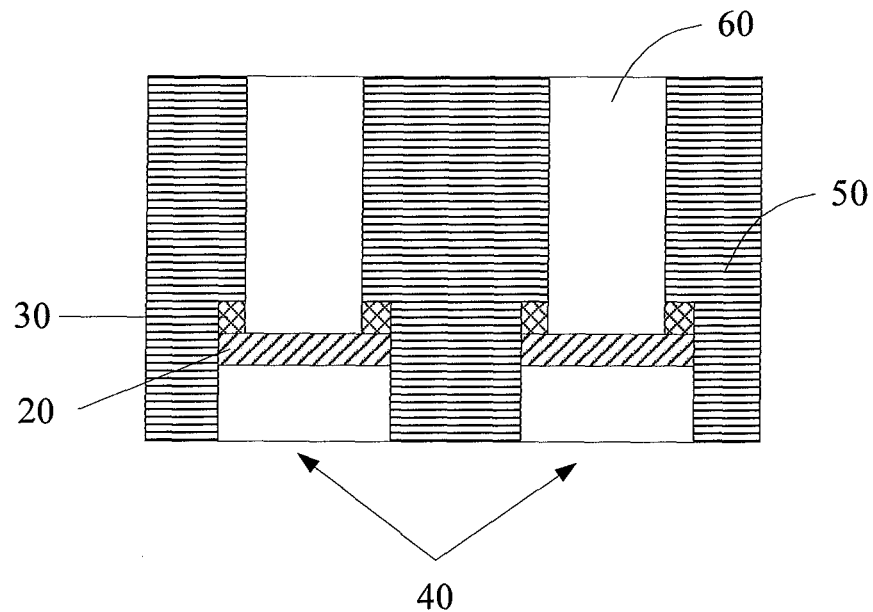
FIG. 6 is a schematic view showing the structure after a contacting hole is formed.

Step S150, the insulating dielectric layer and the passivation layer are etched to form a contacting hole corresponding to the basic unit. Referring to FIG. 6, the insulating dielectric layer 50 is etched to form a contacting hole 60. There is a one to one correspondence between the contacting hole 60 and the basic unit 40, and the passivation layer 30 is etched, which makes the contacting hole 60 reaches the resistance layer 20 of the basic unit 40.

Figure 7:
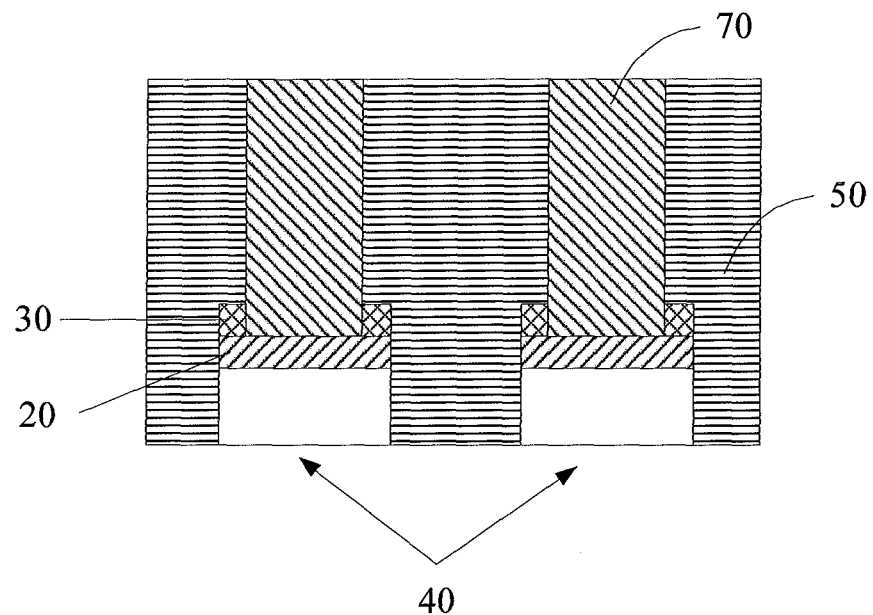
FIG. 7 is a schematic view showing the structure after a metal wire is filled.

Step S160, a metal wire is filled in the contacting hole. Referring to FIG. 7, the contacting hole 60 shown in FIG. 6 is filled with the metal wire 70. In the illustrated embodiment, the metal wire 70 is preferably made of tungsten.

Figure 8:
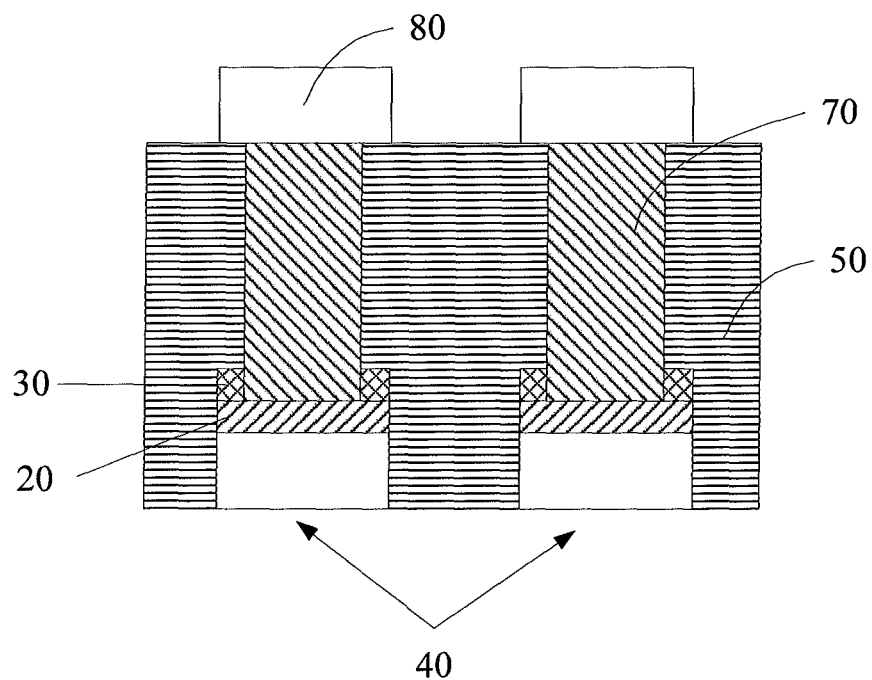
FIG. 8 is a schematic view showing a structure after a second metal layer is formed.

Step S170, a second metal layer is formed. Referring to FIG. 8, a second metal layer 80 is formed on a layer above the metal wire 70. In the illustrated embodiment, the first metal layer 70 and the second metal layer 80 are both made of aluminum. After the step S170, the resistive random access storage unit is substantially formed. The resistive random access storage unit has a storing function, which includes the first metal layer 10, the resistance layer 20, the second metal layer 80, and the metal wire 70 which connects to the resistance layer 20 and the second metal layer 80.

As can be seen from the flow chart, the resistance layer 20 is formed on the first metal layer 10, the first metal layer 10 is easy to be flattened, when the resistance layer 20 is formed, its resistance will be uniformly distributed. Especially, when the resistance layer 20 is formed by a metal oxidization method, uneven oxidization due to surface difference caused by tungsten plugs filling holes can be avoided, thus the resistance is evenly distributed. Besides, a problem of controlling a height of the grinded tungsten plugs can be avoided, and also a problem of wire width limitation caused by a stair difference formed by etching top tungsten oxide can be avoided.

It is to be understood that, the step S110 is not limited to form the resistance layer by first depositing a resistance substrate layer and then oxidizing the resistance substrate layer, other methods can be used to form the resistance layer.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A method of manufacturing a resistive random access storage unit, comprising the following steps:
    forming a resistance layer on a first metal layer having a flat surface;
    forming a passivation layer on the resistance layer;
    performing an etching process to obtain a plurality of basic units, each basic unit comprising the first metal layer, the resistance layer, and the passivation layer, which are laminated sequentially;
    depositing a insulating dielectric layer, and flattening the insulating dielectric layer;
    etching the insulating dielectric layer and the passivation layer to form a contacting hole corresponding to the basic unit;
    filling the contacting hole with a metal wire; and
    forming a second metal layer.

2. The method according to claim 1, wherein said forming the resistance layer on the first metal layer specifically comprises:
    depositing a resistance substrate layer on the first metal layer; and
    oxidizing the resistance substrate layer to obtain an oxide of the resistance substrate layer, and forming the resistance layer.

3. The method according to claim 2, wherein the resistance substrate layer is a tungsten layer, the resistance layer is a tungsten oxide layer.

4. The method according to claim 1, wherein said forming the passivation layer on the resistance layer specifically comprises:
    depositing a nitride layer on the resistance layer using a chemical vapor deposition process.

5. The method according to claim 1, wherein the first metal layer and the second metal layer are both aluminum layers.

* * * * *